(12) United States Patent
Brandl et al.

(10) Patent No.: US 12,018,806 B2
(45) Date of Patent: Jun. 25, 2024

(54) HALOGEN LAMP REPLACEMENT

(71) Applicant: OSRAM Opto Semiconductors GmbH, Regensburg (DE)

(72) Inventors: Martin Brandl, Kelheim (DE); Clemens Hofmann, Neutraubling (DE); Daniel Richter, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 23 days.

(21) Appl. No.: 17/768,698

(22) PCT Filed: Dec. 1, 2020

(86) PCT No.: PCT/EP2020/084017
§ 371 (c)(1),
(2) Date: Apr. 13, 2022

(87) PCT Pub. No.: WO2021/121943
PCT Pub. Date: Jun. 24, 2021

(65) Prior Publication Data
US 2023/0265981 A1    Aug. 24, 2023

(30) Foreign Application Priority Data
Dec. 18, 2019   (DE) .......................... 102019219943.7

(51) Int. Cl.
*F21S 41/148*        (2018.01)
*F21S 41/151*        (2018.01)
(Continued)

(52) U.S. Cl.
CPC .......... *F21S 41/192* (2018.01); *F21S 41/148* (2018.01); *F21S 41/151* (2018.01); *F21S 45/47* (2018.01); *F21Y 2107/90* (2016.08)

(58) Field of Classification Search
CPC ...... F21S 41/192; F21S 41/148; F21S 41/151; F21S 45/47; F21Y 2107/90
See application file for complete search history.

(56) References Cited

U.S. PATENT DOCUMENTS 8,801,247 B2 *   8/2014   Sugie ................... F21S 41/155
                                                           362/516
9,958,131 B2 *   5/2018   Tai ........................ F21S 41/145
(Continued)

FOREIGN PATENT DOCUMENTS

CN      102213389 A     10/2011
CN      103477457 A     12/2013
(Continued)

OTHER PUBLICATIONS

International Search Report for International Patent Application No. PCT/EP2020/084017, mailed Mar. 31, 2021 (7 pages).
(Continued)

*Primary Examiner* — Evan P Dzierzynski
(74) *Attorney, Agent, or Firm* — ARENTFOX SCHIFF LLP

(57) ABSTRACT

The disclosure relates to a halogen lamp replacement, in particular for car headlights, having a carrier plate which is covered on both main surfaces by structured electrically conductive layers, to which at least one respective light-emitting component, in particular at least one respective light-emitting-diode chip, is attached, the carrier plate being designed to dissipate heat generated by the light-emitting components to a heat sink formed by a coupling structure.

22 Claims, 4 Drawing Sheets

(51) Int. Cl.
  *F21S 41/19*     (2018.01)
  *F21S 45/47*     (2018.01)
  *F21Y 107/90*    (2016.01)

(56)           References Cited

U.S. PATENT DOCUMENTS

| | | | |
|---|---|---|---|
| 10,208,910 B2* | 2/2019 | Hogrefe | F21S 41/663 |
| 2009/0296416 A1* | 12/2009 | Luo | F21S 43/30 |
| | | | 362/487 |
| 2010/0213809 A1* | 8/2010 | Roehl | F21K 9/232 |
| | | | 313/317 |
| 2014/0027807 A1 | 1/2014 | Tasaki et al. | |
| 2014/0355286 A1* | 12/2014 | Arita | F21S 41/36 |
| | | | 362/516 |
| 2016/0290585 A1* | 10/2016 | Lee | F21S 41/151 |
| 2018/0045391 A1* | 2/2018 | Kuo | F21V 29/76 |
| 2018/0335190 A1* | 11/2018 | Kresge | F21S 41/663 |
| 2019/0154220 A1 | 5/2019 | Vincens | |
| 2019/0277455 A1 | 9/2019 | Xu | |
| 2021/0025582 A1* | 1/2021 | Xie | F21K 9/232 |
| 2021/0348738 A1* | 11/2021 | Epmeier | F21S 41/192 |

FOREIGN PATENT DOCUMENTS

| | | |
|---|---|---|
| CN | 110375261 A | 10/2019 |
| DE | 202018000609 U1 | 3/2018 |
| DE | 102017222631 A1 | 6/2019 |
| JP | 2011222366 A | 11/2011 |
| JP | 2014120388 A | 6/2014 |
| WO | 2009037053 A1 | 3/2009 |
| WO | 2015032896 A1 | 3/2015 |
| WO | 2015091462 A1 | 6/2015 |

OTHER PUBLICATIONS

Office Action in CN202080088434.5, mailed Dec. 21, 2023, 16 pages.

* cited by examiner

HALOGEN LAMP REPLACEMENT

This patent application is a 35 U.S.C. § 371 National Phase of PCT Application No. PCT/EP2020/084017, filed Dec. 1, 2020, which claims the priority of German Patent Application No. 10 2019 219 943.7, filed Dec. 18, 2019, the disclosures of which are hereby incorporated by reference.

The present invention relates to a halogen lamp replacement, in particular a lamp for use in an automobile, in particular as a headlamp, in particular as a front headlamp, in particular as a replacement for a halogen lamp comprising a filament. Externally visible forward lighting is intended to be provided in a simple manner, particularly for an automobile.

FIG. 1 illustrates one exemplary embodiment of a conventional halogen lamp replacement. Typical construction thicknesses that arise are in the range of at least 5 mm. However, since for halogen lamps that are preferably to be replaced, in particular having the commercial designation H7, the region of light emitting components is intended to form a cylindrical volume having a diameter of up to and including 1.4 mm, this conventional halogen lamp replacement cannot be used. Correct projection of this unconventional light emitting volume onto a road by the headlight is not ensured.

It is an object of the invention to provide a halogen lamp replacement, in particular for an automobile headlight, in such a way that a maximum thickness of the halogen lamp replacement in the region of light emitting components is small, in particular less than or equal to 1.4 mm. An emission characteristic is intended to be optically equivalent to that of a filament of a conventional halogen lamp to be replaced. Furthermore, the heat generated during operation of the halogen lamp replacement is intended to be effectively dissipated. The halogen lamp replacement is intended to be producible in a cost-effective manner.

The object is achieved by means of a halogen lamp replacement having the features of the main claim and by means of a method for producing a halogen lamp replacement in accordance with the features of the alternative independent claim.

In accordance with a first aspect, a halogen lamp replacement, in particular for automobile headlights, is proposed, comprising a carrier plate covered on its two main surfaces in each case with a structured electrically conductive layer, to which in each case at least one light emitting component, in particular at least one light emitting diode chip, is connected, the carrier plate being configured to dissipate heat generated by the light emitting components to a heat sink formed by means of a coupling structure.

A respective structured electrically conductive layer provides on a respective main surface conductor tracks and/or conductor areas for electrically contacting light emitting components with the positive pole and/or the negative pole of an electrical power supply source.

The light emitting components are mechanically, electrically and thermally connected.

A carrier plate comprises a first main surface and a second main surface situated opposite the first main surface, at least one side surface extending between the first main surface and the second main surface. The carrier plate provides a planar substrate. The carrier plate provides plane main surfaces, in particular.

In accordance with a second aspect, a method for producing a halogen lamp replacement, in particular for automobile headlights, is proposed, comprising the following steps: forming a carrier plate covered on its two main surfaces in each case with a structured electrically conductive layer, to which in each case at least one light emitting component, in particular at least one light emitting diode chip, is connected, the carrier plate being configured to dissipate heat generated by the light emitting components to a heat sink formed by means of a coupling structure.

The light emitting components, in particular the light emitting diode chips, are electrically and mechanically connected to the coated carrier plate. Heat can be effectively dissipated from the light emitting components, in particular from the light emitting diode chips, to the carrier plate.

In contrast to the conventional halogen lamp replacement in accordance with FIG. 1, it has been recognized that it is advantageous to avoid an additional carrier between two carriers of light emitting components and thus both securing of the two carriers to said additional carrier and additional thermal transition surfaces arising as a result. Costs can be reduced in this way since, with a saving of material, a simpler system in comparison with the prior art in accordance with FIG. 1 can be provided.

The carrier plate can act in a simple manner as mechanically stable carrying structure and as thermally conductive heat dissipation for the electrically contacted light emitting components, in particular for the light emitting diode chips. Since the carrier plate already performs essential functions, additional substrates or layers are dispensed with. A thickness of a proposed halogen lamp replacement in the region of the light emitting components is thus provided as small. The distance between the light emitting components arranged on main surfaces situated opposite one another is effectively reduced.

Further configurations are claimed by the dependent claims.

In accordance with one configuration, the carrier plate can comprise a core layer. A core layer is providable in a simple manner.

In accordance with a further configuration, the carrier plate can comprise a first partial carrier and a second partial carrier, the first main surfaces of which are covered in each case with the structured electrically conductive layer and the second main surfaces of which are mechanically and thermally connected to one another. A production method can be simplified in this way since the first partial carrier and the second partial carrier can be formed approximately identically.

The second main surfaces of the first and second partial carriers are not covered by structured electrically conductive layers. Mechanical connection encompasses in particular adhesive bonding, welding, soldering, screwing, riveting, for example, in such a way that the two partial carriers act as one mechanical unit. Thermal connection encompasses in particular forming a heat transfer with a high thermal conductance by using thermally conductive connection material in such a way that both partial carriers can act as a heat sink.

In accordance with a further configuration, the carrier plate can form a region with a plug-in function, said region extending spatially beyond the region of the light emitting components.

The carrier plate is enlarged beyond the light emitting region. A main surface enlargement additionally leads to a side surface enlargement of the carrier plate. If, in the case of a circular carrier plate, for example, the radius of the main surfaces is enlarged, the circumference and thus the side surface are automatically enlarged. With the latter a region forming a plug-in function arises, by means of which region the carrier plate can be secured.

In accordance with a further configuration, the coupling structure can comprise a cylindrical metal body comprising cooling ribs and providing the heat sink, and a clamp terminal providing a receiving function can be formed on that side of said metal body which faces the carrier plate, the carrier plate, in particular for mechanical, thermal and/or electrical coupling, being secured in said clamp terminal. The coupling structure can be produced as a die-cast aluminum body.

The carrier plate can thus be plugged into a mechanical mount. Mechanical coupling here can encompass for example pushing the carrier plate into a clamp terminal, which clamps said carrier plate. In addition to mechanical coupling, thermal coupling can encompass forming a heat transfer with a high thermal conductance between carrier plate and clamp terminal, thermal paste being usable for this purpose. In this way, moreover, the thermal performance is additionally improved since the thermal transition surface (the thermal interface) is displaced essentially in the direction toward the metal body.

In accordance with a further configuration, the coupling structure, on its side facing the carrier plate, can form a clamp terminal providing a receiving function, the carrier plate, for mechanical, thermal and/or electrical coupling, being secured in said clamp terminal. In this case, a thermal paste can be used for the mechanical and thermal coupling between the clamp terminal and the carrier plate.

In accordance with a further configuration, the coupling structure can be secured to an automobile headlight by means of respective further plug-receptacle systems or plug-socket pairs, in particular for mechanical, thermal and/or electrical coupling. By means of the coupling structure, the halogen lamp replacement can be installed in and demounted from an automobile headlight in a simple manner.

In accordance with a further configuration, the carrier plate can comprise a metal and a respective electrically passivating layer can be produced between the carrier plate and the structured electrically conductive layers. A passivating layer is required if the carrier plate is produced such that it is electrically conductive and in particular metallic. In this way, the structured electrically conductive layers can be electrically insulated from the carrier plate in a simple manner.

In accordance with a further configuration, the carrier plate can comprise aluminum (Al) and the electrically passivating layers can comprise aluminum oxide (AlO). This configuration is producible in a simple manner.

In accordance with a further configuration, the carrier plate can comprise copper (Cu) and the electrically passivating layers can comprise aluminum nitride (AlN). This configuration is likewise producible in a simple manner.

In accordance with a further configuration, the carrier plate can be formed as ceramic and the structured electrically conductive layers can be formed directly on the ceramic. By using an electrically nonconductive carrier plate, it is possible to avoid an electrical passivation.

In accordance with a further configuration, the ceramic can comprise aluminum oxide (AlO).

In accordance with a further configuration, the ceramic can comprise aluminum nitride (AlN).

In accordance with a further configuration, the carrier plate together with the two structured electrically conductive layers can be produced as a printed circuit board (PCB). Printed circuit boards are known, readily available and easy to produce or easy to process. Printed circuit boards according to the present invention enable an expedient thermal performance on account of their high thermal conductivity and the reduction of the number of thermal transitions.

In accordance with a further configuration, the halogen lamp replacement can be formed with a maximum thickness of less than or equal to 1.4 mm in the region of the light emitting components. This shows that a reduction of the system thickness is possible. In this way it is possible to ensure that, in the case of a use in an automobile headlight, road users cannot be dazzled. Consequently, there is a correct projection of the light source by the headlight and dazzling of oncoming traffic is avoided.

With the use of chip packages of the size of the light emitting chips it is likewise possible to produce a maximum thickness of less than or equal to 1.4 mm in the region of two chips arranged on main surfaces situated opposite one another.

In accordance with a further configuration, the light emitting components, in particular the light emitting diode chips, can be positioned opposite one another axially symmetrically on different main surfaces. A concentrated region of the emission of light arises in this case. An emission angle of up to 360° can thus be provided. By means of the axial symmetry, during operation a symmetrical introduction of heat from all the light emitting components into the carrier plate is provided in such a way that no, in particular one-sided, thermal gradients or stresses arise which could lead to thermally dictated material strains, to warpages and to material wear. In this way the heat generated can be dissipated to the heat sink symmetrically and homogeneously by means of the coupling structure. Furthermore, by means of the axial symmetry, it is possible moreover to provide the optical emission characteristic of the light emitting components independently of thermally caused material strains.

In accordance with a further configuration, the light emitting components, in particular the light emitting diode chips, can be formed as flip-chips and/or as chip size packages (CSP). The light emitting components can thus be mounted directly on printed circuit boards in a simple manner.

In accordance with a further configuration, a respective converter layer for converting the emitted electromagnetic radiation into white light can be formed on the light emitting components, in particular on the light emitting diode chips. A white conversion can be effected in a simple manner by means of the converter layer construction. In this case, the light emitted by the emitting components may initially be at least partly invisible. Suitable converter materials are luminescent, in particular, and can be fluorescent or phosphorescent in this case.

In accordance with a further configuration, on the light emitting components per main surface at least one optical lens having a bat wing emission characteristic for forming a total emission characteristic with a total emission angle of up to 360° can be produced. Such an optical lens can be produced in a simple manner by means of molding. An optical emission characteristic of an optical lens that is referred to as "bat wing" has a cross section in the shape of two butterfly or bat wings. An advantageous emission characteristic can be formed in this way. An emission angle of up to 180° can be produced for each main surface. A total emission angle of up to 360° can thus be produced for both main surfaces together.

By means of the use of printed circuit boards, molding processes can be employed straightforwardly for applying optical lenses. In this way an emission characteristic can be shaped flexibly for the totality of the connected light emitting components. By means of the lenses, 360° emissions that are identical to those of the halogen filaments to be replaced can be realized in a simple manner.

In accordance with a further configuration, a reflection layer for reflecting white light can be formed in a manner adjoining the light emitting components, in particular the light emitting diode chips. In this way, an emission characteristic can be improved further in a simple manner. Alternatively, the reflectance of the reflection layer can be set to at least 70% for the entire spectrum of the light visible to humans (VIS spectrum) and/or at least 80% for the wavelengths emitted by the light emitting components.

In accordance with a further configuration, the light emitting components, which are light emitting diode chips in particular, can be electrically connected in series with one another. In this way, the halogen lamp replacement for a required power consumption can easily be connected to an operating voltage of 12 V present in an automobile.

The invention will be described in greater detail on the basis of exemplary embodiments in association with the figures, in which FIG. 1 shows one exemplary embodiment of a conventional halogen lamp replacement;

Figure 1:
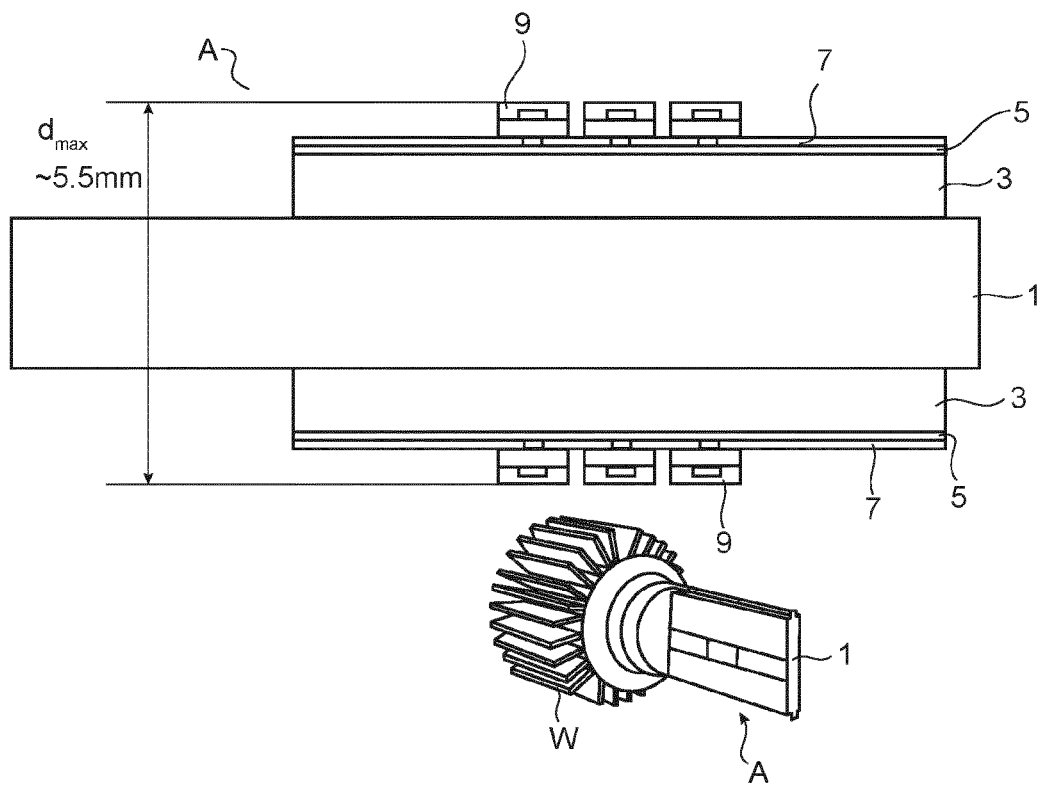
FIG. 1 shows one exemplary embodiment of a conventional halogen lamp replacement.

The halogen lamp replacement A illustrated here comprises a planar metallic base element 1, on which two metallic layers 3 with structured electrically conductive layers 7 are arranged. A dielectric layer 5 is formed between the respective metallic layer 3 and the associated structured electrically conductive layer 7. Here three packaged light emitting diode chips 9 are mechanically and electrically connected to the respective structured electrically conductive layer 7.

FIG. 1 shows the planar metallic base element 1 having a thickness of approximately 2 mm. On the two main surfaces of the planar metallic base element 1 there is arranged the respective metallic layer 3, in particular comprising Al or Cu, having a thickness of approximately 1 mm. On the sides facing away from the planar metallic base element 1, the metallic layers 3 are covered in each case by the dielectric layer 5, on which the structured electrically conductive layer 7, in particular comprising Cu, was applied. The light emitting diodes 9 are arranged thereon, said diodes being formed here in packages on ceramic substrates. These light emitting diode packages have a thickness of approximately 0.75 mm. A thickness in the region of the light emitting diodes of approximately 5.5 mm thus results for this halogen lamp replacement A.

During production, in a first step, the individual light emitting diodes 9 are applied to two separate combinations of metallic layer 3, dielectric layer 5 and structured electrically conductive layer 7. In a subsequent step, these two separate combinations are applied to the planar metallic base element 1, which acts as a heat sink. The carrier substrates are thus separately applied to a further heat conductor.

Moreover, in order to provide the halogen lamp replacement A, the planar metallic base element 1 can be formed as a plate, for example comprising Al, which is connected to a further heat sink W.

The conventional halogen lamp replacement A illustrated here cannot replace a specific preferred conventional halogen lamp for an automobile headlight on account of the dimensions thereof. This is because for the halogen lamp preferably to be replaced a light emitting region is intended to have a cylindrical volume with a diameter of up to and including 1.4 mm. Only then is it ensured that the headlight correctly projects this light onto a road.

Since the conventional halogen lamp replacement A described here together with the light emitting diodes 9 has a thickness of greater than 1.4 mm, a correct projection is not ensured. The probability of dazzling oncoming traffic is thus high.

Figure 2:
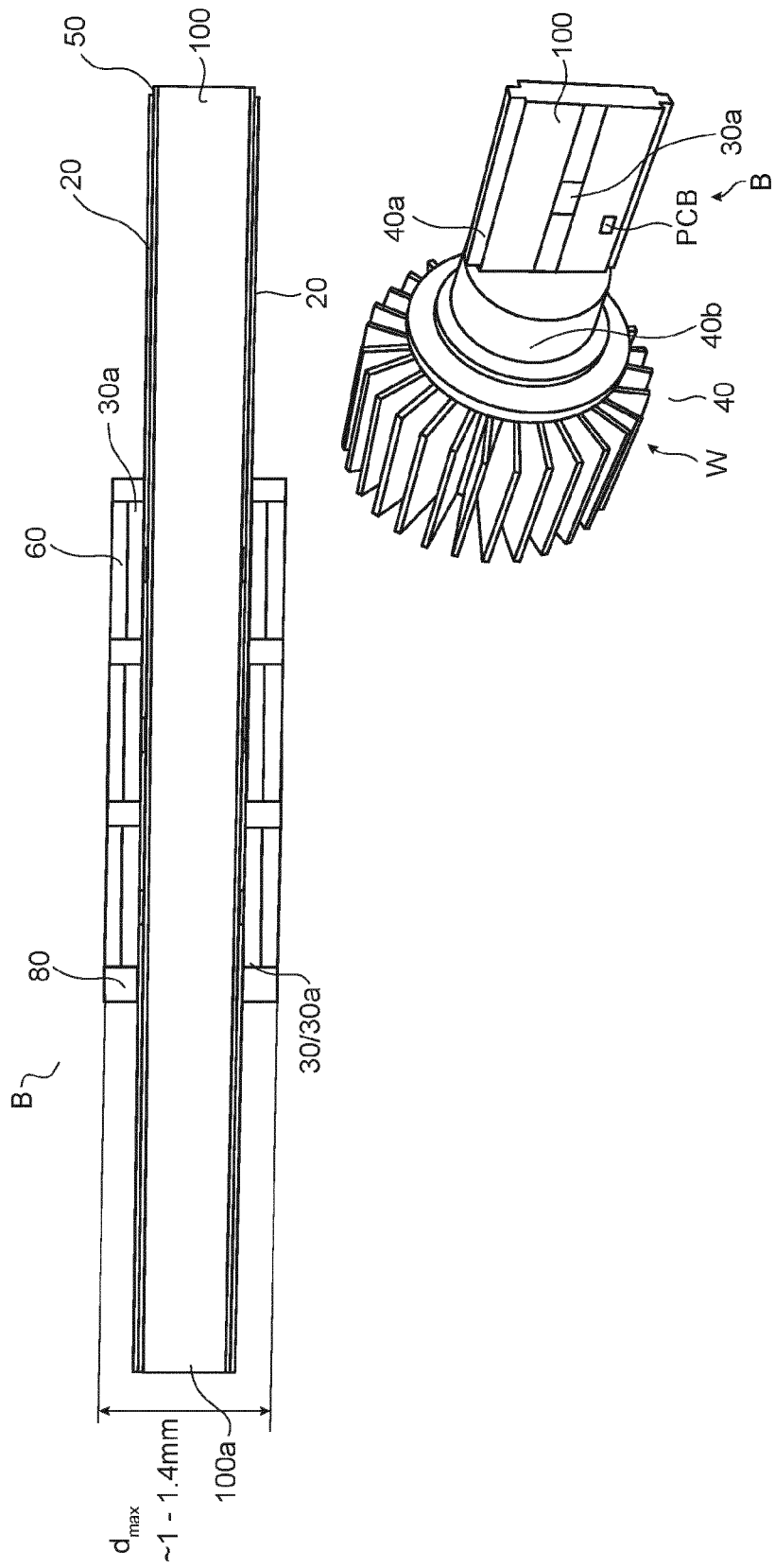
FIG. 2 shows one exemplary embodiment of a halogen lamp replacement according to the invention.

FIG. 2 shows one exemplary embodiment of a halogen lamp replacement B according to the invention.

The carrier plate 100 here comprises a core layer 100*a*, which is covered on both main surfaces thereof in each case with a structured electrically conductive layer 20. In each case at least one light emitting component 30 is connected to said layer. A respective light emitting component 30 here is a light emitting diode chip 30*a*. FIG. 2 illustrates six light emitting diode chips 30*a*, which are mechanically, electrically and thermally connected to the carrier plate 100 and the respective structured electrically conductive layer 20.

The core layer 100*a* is moreover formed thermally in such a way that heat that arises during the operation of the light emitting diode chips 30*a* is absorbed by the core layer 100*a* and dissipated to a heat sink W in a simple manner.

The carrier plate 100 metallized on two sides and comprising the core layer 100*a* is preferably produced as a printed circuit board (PCB). The carrier plate 100 together with the two structured electrically conductive layers 20 forms a printed circuit board (PCB).

The core layer 100*a* is produced from one material here. For the case where this material is electrically conductive, a respective electrically passivating layer 50 for avoiding electrical short circuits must be produced between the two main surfaces and the structured electrically conductive layers 20. If the core layer 100*a* comprises aluminum (Al), for example, then electrically insulating and passivating layers 50 comprising aluminum oxide (AlO) are suitable. Structured electrically conductive layers 20 that likewise preferably comprise aluminum (Al) are applied to said layers in a simple manner. If the core layer 100*a* alternatively comprises copper (Cu), then electrically insulating and passivating layers 50 comprising aluminum nitride (AlN) are suitable. Structured electrically conductive layers 20 that likewise preferably comprise copper (Cu) are applied to said layers in a simple manner. For the case where the core layer 100*a* consists of electrically insulating material, the structured electrically conductive layers 20 are applied directly to the two main surfaces of the core layer 100*a*. By way of example, the core layer 100*a* comprises a ceramic material. If the latter is aluminum oxide (AlO), then aluminum (Al) is suitable as material for the structured electrically conductive layers 20. If the ceramic material is aluminum nitride (AlN), then copper (Cu) is suitable as material for the structured electrically conductive layers 20.

Besides copper (Cu) or aluminum (Al), alternative materials can be used as materials of the structured electrically conductive layers 20. By way of example, gold (Au) or gold alloys is/are usable. Moreover, silver (Ag) or silver alloys is/are usable. Other noble metals are likewise possible. Furthermore, silver-palladium can be used. Further materials can be nickel (Ni), rhodium (Rh), platinum (Pt), or can comprise an alloy of these materials. This material selection can be effected independently of the material of the carrier plate 100. An electrically insulating material must be selected according to the insulation requirements.

The halogen lamp replacement B illustrated here has a maximum thickness $d_{max}$ of up to 1.4 mm here in the region of the light emitting diode chips 30*a*. Smaller maximum thicknesses $d_{max}$, for example in the range of up to 1 mm, are likewise providable.

The light emitting diode chips 30*a* positioned on the two opposite main surfaces are situated opposite one another axially symmetrically. The light emitting diode chips 30*a* are embodied here as flip-chips. The electrical contacting is thus effected on the sides of the light emitting diode chips 30*a* facing the core layer 100*a*.

In accordance with the configuration, a respective converter layer 60 for converting the emitted radiation into white light is formed on the light emitting diode chips 30*a*. The converter layer 60 likewise converts non-visible light of the light emitting diode chips 30*a* into white light.

Figure 5:
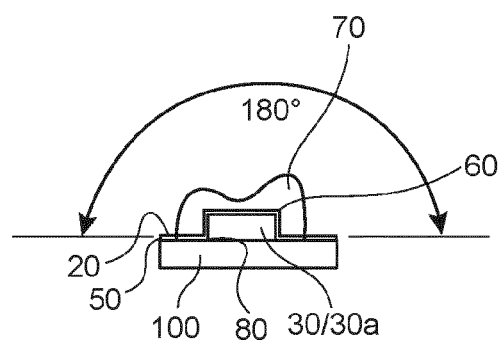
FIG. 5 shows a further exemplary embodiment of an emission characteristic.

In accordance with one configuration, with reference to FIG. 5, on the light emitting diode chips 30*a* per main surface at least one optical lens 70 having a "bat wing" emission characteristic for forming a total emission characteristic with a total emission angle of up to 360° is produced.

On the respective main surface a reflection layer 80 for reflecting white light is formed in a manner adjoining the light emitting diode chips 30*a*. Alternatively, the reflectance of the reflection layer 80 is set to at least 70% for the entire spectrum of the light visible to humans (VIS spectrum) and/or at least 80% for the wavelengths emitted by the light emitting components 30.

The light emitting diode chips 30*a* are electrically connected in series with one another.

For further configuration, the core layer 100*a* extends beyond the region in which the light emitting components 30 are arranged, which here are embodied as light emitting diodes 30*a*. For example in the area of a larger rectangle the carrier plate 100 is formed as a printed circuit board (PCB) in such a way that the latter is connected to a coupling structure 40 in a simple manner. The carrier plate 100 provides a plug-in function and a heat dissipating function by means of the region extending spatially beyond the region of the light emitting diode chips 30*a*.

The coupling structure 40, on its side facing the carrier plate 100, forms a clamp terminal 40*a* providing a receiving function, the carrier plate 100, in particular for mechanical, thermal and/or electrical coupling, being secured in said clamp terminal. In this regard, the carrier plate 100 forming a flat parallelepiped is introduced by two narrow lateral surfaces situated opposite one another into the clamp terminal 40*a* of the coupling structure 40 in such a way that the mechanical and thermal coupling is thus produced. For this connection, a thermal paste is additionally used between the clamp terminal 40*a* and the core layer 100*a*.

Two elements providing a plug-in function and a receiving function for a connection are hereinafter generally referred to as a plug-socket pair.

The coupling structure 40 additionally comprises a cylindrical metal body acting as a heat sink W, said metal body forming cooling ribs. The coupling structure 40 is produced as die-cast aluminum. Other metals, in particular light metals, are likewise usable.

Electrical coupling of the carrier plate 100 to the coupling structure 40 can encompass forming at least two material transitions with a high electrical conductance between carrier plate 100 and coupling structure 40, wherein the coupling structure 40, for example on a side facing away from the carrier plate 100, can form two electrodes for electrical connection to an automobile headlight, said electrodes not being illustrated in FIG. 2. Alternatively, without the coupling structure 40, the light emitting components 30 can be brought directly electrically into contact with a headlight power supply connection of an automobile by means of two electrically insulated wires forming external electrodes of the halogen lamp replacement B. The electrodes and wires are not illustrated in FIG. 2.

By means of the coupling structure 40, the halogen lamp replacement B according to the invention is connected to an automobile headlight during operation. For this purpose, by means of further plug-socket pairs, the coupling structure 40 connects the halogen lamp replacement B according to the invention to an automobile headlight, in particular for mechanical, thermal and/or electrical coupling.

In this case, for example, in a plug-receptacle pair, the coupling structure 40 can perform the plug-in function, in which case an automobile headlight can provide a receiving function. For this purpose, the coupling structure 40, between the cooling rib region and the clamp terminal 40*a*, can comprise a further cylindrical region 40*b* with a smooth lateral surface with a plug-in function. In this way, the halogen lamp replacement B can be mechanically connected to the automobile headlight by means of the coupling structure.

The coupling structure 40 acts as a heat sink W in particular by means of the cooling ribs. The coupling structure 40 can also additionally be coupled to an automobile headlight thermally for further heat dissipation. This can be implemented by means of the further cylindrical region 40*b*, for example.

For an electrical coupling and/or connection of the halogen lamp replacement B to a power supply and/or signal transmission network, in particular for an automobile headlight, the coupling structure 40 can comprise further means, in particular electrical insulations, electrical lines and electrodes, which are not illustrated in FIG. 2.

The coupling structure 40, on its side facing away from the carrier plate 100, can form two external electrodes, not illustrated in FIG. 2, which likewise as parts of plug-receptacle pairs can be electrically connected to the electrical power supply of an automobile headlight. Said external electrodes can provide the plug-in function. Terminations of electrical connection cables, not illustrated in FIG. 2, can provide the receiving function. Alternatively, it is possible to form electrically insulated power supply wires, not illustrated in FIG. 2, with external electrodes directly from the carrier plate 100 as far as the side of the coupling structure facing away from said carrier plate.

A halogen lamp replacement B according to the invention comprises in particular a carrier plate 100 populated with light emitting diode chips 30*a* and covered with two structured electrically conductive layers 20, said carrier plate being secured and electrically connected to a coupling structure 40.

Figure 3:
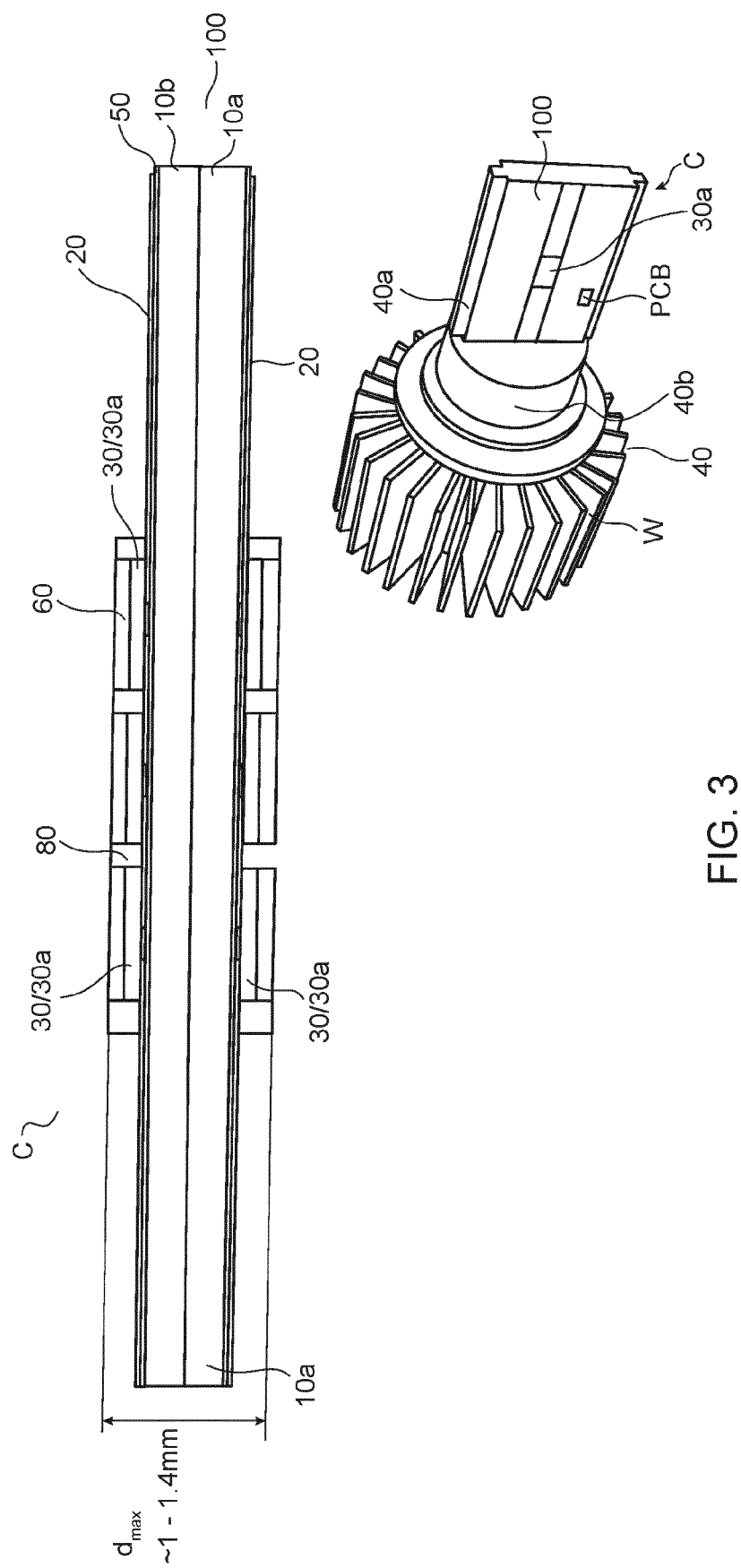
FIG. 3 shows a further exemplary embodiment of a halogen lamp replacement according to the invention.

FIG. 3 shows a further exemplary embodiment of a halogen lamp replacement C according to the invention.

The halogen lamp replacement C illustrated in FIG. 3 develops the halogen lamp replacement B illustrated in FIG. 2 in such a way that the carrier plate 100 comprises two partial carriers 10*a* and 10*b*.

Furthermore, FIG. 3 has the same features as have been described in association with FIG. 2. Identical reference signs identify identical features.

The carrier plate 100 here comprises two partial carriers 10a and 10b populated with light emitting components 30 and at least partly covered with a structured electrically conductive layer 20 on one side in each case. The first main surfaces of the first partial carrier 10a and of the second partial carrier 10b here are populated with six light emitting diode chips 30a as examples of light emitting components 30, which are mechanically, electrically and thermally connected to the carrier plate 100 and the respective structured electrically conductive layer 20. The second main surfaces of the first partial carrier 10a and of the second partial carrier 10b are mechanically and thermally connected to one another. In accordance with this exemplary embodiment, the first and second main surfaces of the two partial carriers 10a and 10b are congruent and bear flush against one another. Accordingly, the areal extent of both partial carriers 10a and 10b is the same. Both partial carriers 10a and 10b mechanically reinforce one another in this way. The two partial carriers 10a and 10b are additionally thermally coupled to one another in such a way that heat that arises during operation of the light emitting diode chips 30a is absorbed by the two partial carriers 10a and 10b and dissipated to a heat sink W in a simple manner.

The first partial carrier 10a and the second partial carrier 10b form the carrier plate 100 and are preferably produced in each case as printed circuit boards (PCBs) connected to one another on the rear side. In this way, the carrier plate 100 together with the two structured electrically conductive layers 20 likewise forms a printed circuit board (PCB).

The first partial carrier 10a and the second partial carrier 10b are produced from an identical material here. For the case where this material is electrically conductive, a respective dielectric or electrically passivating layer 50 for avoiding electrical short circuits must be produced between the first main surfaces and the structured electrically conductive layers 20. If the two partial carriers 10a and 10b comprise aluminum (Al), for example, then electrically insulating and passivating layers 50 comprising aluminum oxide (AlO) are suitable. Structured electrically conductive layers 20 that likewise preferably comprise aluminum (Al) are applied to said layers in a simple manner. If the two partial carriers 10a and 10b alternatively comprise copper (Cu), then electrically insulating and passivating layers 50 comprising aluminum nitride (AlN) are suitable. Structured electrically conductive layers 20 that likewise preferably comprise copper (Cu) are applied to said layers in a simple manner. For the case where the two partial carriers 10a and 10b consist of electrically insulating material, the structured electrically conductive layers 20 are applied directly to the first main surfaces of the two partial carriers 10a and 10b. By way of example, the two partial carriers 10a and 10b comprise a ceramic material. If the latter is aluminum oxide (AlO), then aluminum (Al) is suitable as material for the structured electrically conductive layers 20. If the ceramic material is aluminum nitride (AlN), then copper (Cu) is suitable as material for the structured electrically conductive layers 20.

Other material systems are likewise usable, in principle, in accordance with the production of conventional printed circuit boards (PCB).

Besides copper (Cu) or aluminum (Al), alternative materials can be used as materials of the structured electrically conductive layers 20. By way of example, gold (Au) or gold alloys is/are usable. Moreover, silver (Ag) or silver alloys is/are usable. Other noble metals are likewise possible. Furthermore, silver-palladium can be used. Further materials can be nickel (Ni), rhodium (Rh), platinum (Pt), or can comprise an alloy of these materials. This material selection can be effected independently of the material of the carrier plate 100.

The halogen lamp replacement C illustrated here has a maximum thickness $d_{max}$ of approximately 1.4 mm here in the region of the light emitting diode chips 30a. Smaller maximum thicknesses $d_{max}$, for example in the range of up to 1 mm, are likewise providable.

The light emitting diode chips 30a positioned on the opposite first main surfaces are situated opposite one another axially symmetrically or symmetrically with respect to the second main surfaces connected to one another. The light emitting diode chips 30a are embodied here as flip-chips. The electrical contacting is thus effected on the sides of the light emitting diode chips 30a facing the two partial carriers 10a and 10b.

A respective package of the size of the respective light emitting diode chip 30a—likewise referred to as a chip size package (CSP)—can be used here for each light emitting diode chip 30a, said package not being illustrated here.

In accordance with the configuration, a respective converter layer 60 for converting the emitted radiation into white light is formed on the light emitting diode chips 30a. The converter layer 60 likewise converts non-visible light of the light emitting diode chips 30a into white light.

In accordance with one configuration, with reference to FIG. 5, on the light emitting diode chips 30a per main surface at least one optical lens 70 having a bat wing emission characteristic for forming a total emission characteristic with a total emission angle of up to 360° is produced.

On the respective main surface a reflection layer 80 for reflecting white light is formed in a manner adjoining the light emitting diode chips 30a. Alternatively or cumulatively, the reflectance of the reflection layer 80 is set to at least 70% for the entire spectrum of the light visible to humans (VIS spectrum) and/or at least 80% for the wavelengths emitted by the light emitting components 30.

The light emitting diode chips 30a are electrically connected in series with one another here.

For further configuration, the two partial carriers 10a and 10b extend beyond the region in which the light emitting components 30 are arranged, which here are embodied as light emitting diodes 30a. For example in the area of a larger rectangle the carrier plate 100 is formed as a printed circuit board (PCB) in such a way that the latter is connected to a coupling structure 40 in a simple manner. The carrier plate 100 provides a plug-in function and a heat dissipating function by means of the region extending spatially beyond the region of the light emitting diode chips 30a.

The coupling structure 40, on its side facing the carrier plate 100, forms a clamp terminal 40a providing a receiving function and a heat dissipating function, the carrier plate 100, in particular for mechanical, thermal and/or electrical coupling, being secured in said clamp terminal. In this regard, the carrier plate 100 forming a flat parallelepiped is introduced by two narrow lateral surfaces situated opposite one another into the clamp terminal 40a of the coupling structure 40 in such a way that the mechanical and thermal coupling is thus produced. For this connection, a thermal paste is additionally used between the clamp terminal 40a and the two partial carriers 10a and 10b.

Two elements providing a plug-in function and a receiving function are hereinafter generally referred to as a plug-socket pair.

The coupling structure 40 additionally comprises a cylindrical metal body acting as a heat sink W, said metal body forming cooling ribs. The coupling structure 40 is produced as die-cast aluminum. Other metals, in particular light metals, are likewise usable.

Electrical coupling of the carrier plate 100 to the coupling structure 40 can encompass forming at least two material transitions with a high electrical conductance between carrier plate 100 and coupling structure 40, wherein the coupling structure 40, for example on a side facing away from the carrier plate 100, can form two electrodes for electrical connection to an automobile headlight, said electrodes not being illustrated in FIG. 3. Alternatively, without the coupling structure 40, the light emitting components 30 can be brought directly electrically into contact with a headlight power supply connection of an automobile by means of two electrically insulated wires forming external electrodes of the halogen lamp replacement C. The electrodes and wires are not illustrated in FIG. 3.

By means of the coupling structure 40, the halogen lamp replacement C according to the invention is connected to an automobile headlight during operation. For this purpose, by means of further plug-socket pairs, the coupling structure 40 connects the halogen lamp replacement C according to the invention to an automobile headlight, in particular for mechanical, thermal and/or electrical coupling.

In this case, for example, in a plug-receptacle pair, the coupling structure 40 can perform the plug-in function, in which case an automobile headlight can provide a receiving function. For this purpose, the coupling structure 40, between the cooling rib region and the clamp terminal 40a, can comprise a further cylindrical region 40b with a lateral surface with a plug-in function. In this way, the halogen lamp replacement C can be mechanically connected to the automobile headlight by means of the coupling structure.

The coupling structure 40 acts as a heat sink W in particular by means of the cooling ribs. The coupling structure 40 can also additionally be coupled to an automobile headlight thermally for further heat dissipation. This can be implemented by means of the further cylindrical region 40b, for example.

For an electrical coupling and/or connection of the halogen lamp replacement C to a power supply and/or signal transmission network, in particular for an automobile headlight, the coupling structure 40 can comprise further means, in particular electrical insulations, electrical lines and electrodes, which are not illustrated in FIG. 3.

The coupling structure 40, on its side facing away from the carrier plate 100, can form two external electrodes, not illustrated in FIG. 3, which likewise as parts of plug-receptacle pairs can be electrically connected to the electrical power supply of an automobile headlight. Said external electrodes can provide the plug-in function. Terminations of electrical connection cables, not illustrated in FIG. 3, can provide the receiving function. Alternatively, it is possible to form electrically insulated power supply wires, not illustrated in FIG. 3, with external electrodes directly from the carrier plate 100 as far as the side of the coupling structure facing away from said carrier plate.

A halogen lamp replacement C according to the invention comprises in particular a carrier plate 100 populated with light emitting diode chips 30a and metallized on both sides, said carrier plate being secured and electrically connected to a coupling structure 40.

Figure 4:
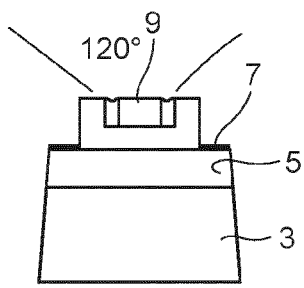
FIG. 4 shows one exemplary embodiment of an emission characteristic.

FIG. 4 shows one exemplary embodiment of an emission characteristic of a halogen lamp replacement. A dielectric layer 5 is formed on a metallic layer 3 and a structured electrically conductive layer 7 is formed on said dielectric layer. On this layer sequence a light emitting diode 9 is arranged and contacted in a package in such a way that an emission angle of approximately 120° results here.

With the use of a further light emitting diode, not illustrated here, which emits in an opposite direction with respect to the first light emitting diode 9, a total emission angle of a maximum of approximately 240° results. Consequently, an emission characteristic which corresponds to the emission characteristic of a filament of a halogen lamp in an automobile headlight cannot be produced in this way.

FIG. 5 shows one configuration of an emission characteristic of a proposed halogen lamp replacement B in accordance with FIG. 2 or C in accordance with FIG. 3 up to an emission angle of 360°.

A structured electrically conductive, in particular metallized, layer 20 is arranged on a first main surface of a carrier plate 100, a dielectric layer or an electrically passivating layer 50 being formed between these two layers for the case where the carrier plate 100 likewise comprises electrically conductive material. A light emitting component 30, which here is a light emitting diode chip 30a, is connected on this layer sequence. A required emitted light spectrum is in each case selected for this. At least one optical lens 70 is arranged here on the light emitting component 30. An optical lens 70 having an emission characteristic corresponding to the shape of two butterfly or bat wings is preferably used. Said lens 70 is fixed on the light emitting component 30 and enables an emission angle of up to 180°. In addition, in order to provide the required emission characteristic, converter layers 60 for converting the emitted electromagnetic radiation into white light and/or reflection layers 80 for the selected reflection of white light are applied. Alternatively or cumulatively, the reflectance of the reflection layer 80 is set to at least 70% for the entire spectrum of the light visible to humans (VIS spectrum) and/or at least 80% for the wavelengths emitted by the light emitting components 30.

With the use of a further light emitting component, not illustrated here, which emits in an opposite direction with respect to the first light emitting component 30, a total emission angle of up to 360° results. The emitting component that is not illustrated is arranged on the second main surface of the carrier plate 100, said second main surface being situated opposite the first main surface, and thus forms a configuration of a halogen lamp replacement in accordance with FIG. 2 or FIG. 3.

An emission characteristic which corresponds to the emission characteristic of a filament of a halogen lamp preferably to be replaced in an automobile headlight can be produced in this way.

Figure 6:
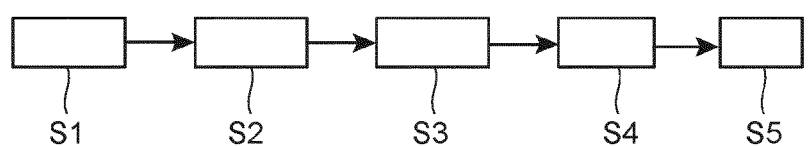
FIG. 6 shows one exemplary embodiment of a method for producing a halogen lamp replacement according to the invention.

FIG. 6 shows one exemplary embodiment of a method for producing a halogen lamp replacement according to the invention. A first step S1 involves forming a carrier plate 100 covered on its two main surfaces in each case with a structured electrically conductive layer 20, to which, in a second step S2, in each case at least one light emitting component 30, in particular at least one light emitting diode chip 30a, is connected. In the first step S1, the carrier plate 100 is configured in such a way that heat generated by the light emitting components 30 is simply dissipated or conducted away to a heat sink formed by means of a coupling structure 40.

In a first embodiment of the first step S1, the carrier plate 100 is produced as a core layer 100a, a respective structured electrically conductive layer 20 being formed on the two main surfaces of said core layer.

In a second embodiment of the first step S1, the carrier plate 100 comprises a first partial carrier 10a and a second partial carrier 10b, which in the first step S1 are mechanically and thermally connected to one another at their second main surfaces and the first main surfaces of which are covered in each case with a structured electrically conductive layer 20. In accordance with a first variant, the covering is effected first and then the connecting. In accordance with a second variant, the connecting is effected first and then the covering. In accordance with a third variant, the covering and connecting are effected simultaneously.

In both embodiments, a following second step S2 involves connecting the light emitting components 30, which are preferably light emitting diode chips 30a, to the structured electrically conductive, in particular metallized, layers 20. The light emitting components 30 are electrically, mechanically and thermally connected in the process.

One substep of the method step S1 concerns the spatial extent and configuration of the carrier plate 100, wherein the latter, by means of a region extending spatially beyond the region of the light emitting components 30, provides, besides a heat dissipating function, a plug-in function in such a way that the carrier plate 100 is connectable to a clamp terminal 40a. The carrier plate 100 is formed for example in the form of a plug-in card.

A third step S3 involves forming a coupling structure 40 with a cylindrical metal body comprising cooling ribs, wherein a clamp terminal 40a providing a receiving function and a heat dissipating function is formed on the side of said metal body facing the carrier plate 100. The coupling structure 40 is produced in particular as a die-cast aluminum body. Other metals, in particular light metals, can likewise be used.

By means of a fourth step S4, the carrier plate 100, in particular for mechanical, thermal and/or electrical coupling, is secured to the clamp terminal 40a.

By means of a fifth step S5, the coupling structure 40 is connected to an automobile headlight by means of respective plug-socket pairs, in particular for mechanical, thermal and/or electrical coupling.

Further substeps or steps concern the material selection, the provision of electrically passivating layers, the configuration of the carrier plate as a printed circuit board (PCB), the maximum thickness of the layer sequence, the position of the light emitting components with respect to one another, their configuration as flip-chips, the use of converter layers, optical lenses and reflection layers, and also the electrical interconnection of the light emitting components.

Further subject matter relates to a method for producing a halogen lamp replacement, in particular for automobile headlights, comprising the following steps:

effected in a first step S1, forming a carrier plate 100 covered on its two main surfaces in each case with a structured electrically conductive layer 20, to which, in a second step S2, in each case at least one light emitting component 30, in particular at least one light emitting diode chip 30a, is connected, the carrier plate 100 being configured to dissipate heat generated by the light emitting components 30 to a heat sink formed by means of a coupling structure 40.

Further subject matter relates to a method comprising, effected in the first step S1, forming the carrier plate 100 as a core layer 10a.

Further subject matter relates to a method comprising, effected in the first step S1, forming S1 the carrier plate 100 by means of a first partial carrier 10a and a second partial carrier 10b, wherein their first main surfaces are covered in each case with the structured electrically conductive layer 20 and their second main surfaces are mechanically and thermally connected to one another, wherein in the second step S2 in each case the at least one light emitting component 30, in particular the at least one light emitting diode chip 30a, is connected to the structured electrically conductive layers 20.

Further subject matter relates to a method comprising forming the carrier plate 100 with a region with a plug-in function and a heat dissipating function, said region extending spatially beyond the region of the light emitting components 30.

Further subject matter relates to a method comprising forming S3 the coupling structure 40 with a cylindrical metal body forming cooling ribs and providing the heat sink, a clamp terminal 40a providing a receiving function being formed on the side of said metal body facing the carrier plate 100, the carrier plate 100, in particular for mechanical, thermal and/or electrical coupling, being secured S4 in said clamp terminal.

Further subject matter relates to a method in which the coupling structure 40 is connected S5 to an automobile headlight by means of respective plug-socket pairs, in particular for mechanical, thermal and/or electrical coupling.

Further subject matter relates to a method in which the carrier plate 100 comprises a metal and a respective electrically passivating layer 50 is produced between the carrier plate 100 and the structured electrically conductive layers 20.

Further subject matter relates to a method in which the carrier plate 100 comprises aluminum (Al) and the electrically passivating layers 50 comprise aluminum oxide (AlO).

Further subject matter relates to a method in which the carrier plate 100 comprises copper (Cu) and the electrically passivating layers 50 comprise aluminum nitride (AlN).

Further subject matter relates to a method in which the carrier plate 100 is formed as ceramic and the structured electrically conductive layers 20 are formed directly on the ceramic S2.

Further subject matter relates to a method in which the ceramic comprises aluminum oxide (AlO).

Further subject matter relates to a method in which the ceramic comprises aluminum nitride (AlN).

Further subject matter relates to a method in which the carrier plate 100 together with the two structured electrically conductive layers 20 forms a printed circuit board PCB.

Further subject matter relates to a method in which the halogen lamp replacement has a maximum thickness $d_{max}$ of less than or equal to 1.4 mm in the region of the light emitting components 30.

Further subject matter relates to a method in which the light emitting components 30 are situated opposite one another axially symmetrically on different main surfaces.

Further subject matter relates to a method in which the light emitting components 30 are formed as flip-chips and/or as chip size packages CSP.

Further subject matter relates to a method in which a respective converter layer 60 for converting the emitted radiation into white light is formed on the light emitting components 30.

Further subject matter relates to a method in which on the light emitting components 30 per main surface at least one optical lens 70 having a bat wing emission characteristic for forming a total emission characteristic with a total emission angle of up to 360° is produced.

Further subject matter relates to a method in which a reflection layer 80 with a high reflectance, of at least 70% for the entire spectrum of the light visible to humans, VIS spectrum, and/or of at least 80% for the wavelengths emitted by the light emitting components 30, is formed in a manner adjoining the light emitting components 30.

Further subject matter relates to a method in which the light emitting components 30 are electrically connected in series with one another.

LIST OF REFERENCE SIGNS

1 Planar metallic base element
3 Metallic layer
5 Dielectric layer
7 Structured electrically conductive layer
9 Light emitting diodes
100 Carrier plate
100a Core layer
10a First partial carrier
10b Second partial carrier
20 Structured electrically conductive layer
30 Light emitting component
30a Light emitting diode chip
40 Coupling structure
40a Clamp terminal
40b Further cylindrical region
50 Electrically passivating layer
PCB Printed circuit board
CSP Chip size package
60 Converter layer
70 Optical lens
80 Reflection layer

The invention claimed is:

1. A halogen lamp replacement, in particular for automobile headlights, comprising:
    a carrier plate covered on its two main surfaces in each case with a structured electrically conductive layer, to which in each case at least one light emitting component, in particular at least one light emitting diode chip, is connected,
    the carrier plate being configured to dissipate heat generated by the at least one light emitting component to a heat sink formed by a coupling structure, and
    the carrier plate having opposing lateral surfaces, narrower than a thickness of a body of the carrier plate, configured to mateably and longitudinally insert into a corresponding clamp terminal of the coupling structure, wherein the opposing lateral surfaces include ridges extending longitudinally along sides of the carrier plate.

2. The halogen lamp replacement as claimed in claim 1, wherein the coupling structure, at a side facing the carrier plate, forms the clamp terminal providing a receiving function, the carrier plate, for mechanical, thermal and/or electrical coupling, being secured in said clamp terminal, and
    a thermal paste being used for the mechanical and thermal coupling between the clamp terminal and the carrier plate.

3. The halogen lamp replacement as claimed in claim 1, wherein the carrier plate comprises a core layer.

4. The halogen lamp replacement as claimed in claim 1, wherein the carrier plate comprises a first partial carrier and a second partial carrier, second main surfaces of which are mechanically and thermally connected to one another, and first main surfaces of which are covered in each case with the structured electrically conductive layer, to which in each case the at least one light emitting component, in particular the at least one light emitting diode chip, is connected.

5. The halogen lamp replacement as claimed in claim 1, wherein the carrier plate forms a region with a plug-in function and a heat dissipating function, said region extending spatially beyond the region of the light emitting components.

6. The halogen lamp replacement as claimed in claim 1, wherein the coupling structure comprises a cylindrical metal body comprising cooling ribs and providing the heat sink.

7. The halogen lamp replacement as claimed in claim 6, wherein the coupling structure is connected to an automobile headlight by respective plug-socket pairs, for mechanical, thermal and/or electrical coupling.

8. The halogen lamp replacement as claimed in claim 1, wherein the carrier plate comprises a metal and a respective electrically passivating layer is produced between the carrier plate and the structured electrically conductive layers.

9. The halogen lamp replacement as claimed in claim 8, wherein the carrier plate comprises aluminum and the electrically passivating layers comprise aluminum oxide.

10. The halogen lamp replacement as claimed in claim 8, wherein the carrier plate comprises copper and the electrically passivating layers comprise aluminum nitride.

11. The halogen lamp replacement as claimed in claim 1, wherein the carrier plate is formed as ceramic and the structured electrically conductive layers are formed directly on the ceramic.

12. The halogen lamp replacement as claimed in claim 11, wherein the ceramic comprises aluminum oxide.

13. The halogen lamp replacement as claimed in claim 11, wherein the ceramic comprises aluminum nitride.

14. The halogen lamp replacement as claimed in claim 1, wherein the carrier plate together with the two structured electrically conductive layers forms a printed circuit board.

15. The halogen lamp replacement as claimed in claim 1, wherein the halogen lamp replacement has a maximum thickness of less than or equal to 1.4 mm in a region of the light emitting components.

16. The halogen lamp replacement as claimed in claim 1, wherein the light emitting components are situated opposite one another axially symmetrically on different main surfaces.

17. The halogen lamp replacement as claimed in claim 1, wherein the light emitting components are formed as flip-chips and/or as chip size packages.

18. The halogen lamp replacement as claimed in claim 1, wherein a respective converter layer for converting the emitted radiation emitted by the light emitting components into white light is formed on the light emitting components.

19. The halogen lamp replacement as claimed in claim 1, wherein a reflection layer, with a high reflectance of at least 70% for an entire spectrum of light visible to humans (VIS spectrum) and/or of at least 80% for wavelengths emitted by the light emitting components, is formed in a manner adjoining the light emitting components.

20. The halogen lamp replacement as claimed in claim 1, wherein the light emitting components are electrically connected in series with one another.

21. The halogen lamp replacement as claimed in claim 1, further comprising:

on the at least one light emitting component per main surface, at least one optical lens having a bat wing emission characteristic for forming a total emission characteristic with a total emission angle of up to 360°.

22. A method for producing a halogen lamp replacement, in particular for automobile headlights, comprising:

forming a carrier plate covered on its two main surfaces in each case with a structured electrically conductive layer, and connecting, in each case, at least one light emitting component, in particular at least one light emitting diode chip, to the carrier plate, the carrier plate being configured to dissipate heat generated by the light emitting components to a heat sink formed by a coupling structure, the carrier plate having opposing lateral surfaces, narrower than a thickness of a body of the carrier plate, configured to mateably and longitudinally insert into a corresponding clamp terminal of the coupling structure, wherein the opposing lateral surfaces include ridges extending longitudinally along sides of the carrier plate.

\* \* \* \* \*